United States Patent
Lee et al.

(10) Patent No.: US 8,098,227 B2
(45) Date of Patent: Jan. 17, 2012

(54) GATE DRIVING CIRCUIT AND DISPLAY APPARATUS HAVING THE SAME

(75) Inventors: Hong-Woo Lee, Cheonan-si (KR); Jong-Hwan Lee, Anyang-si (KR); Beom-Jun Kim, Seoul (KR); Sung-Man Kim, Seoul (KR); Gyu-Tae Kim, Cheonan-si (KR); Kyoung-Jun Jang, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 615 days.

(21) Appl. No.: 12/338,182

(22) Filed: Dec. 18, 2008

(65) Prior Publication Data

US 2009/0189679 A1    Jul. 30, 2009

(30) Foreign Application Priority Data

Jan. 29, 2008    (KR) .................. 10-2008-0009212

(51) Int. Cl.
*G09G 3/36*    (2006.01)

(52) U.S. Cl. ............... 345/100; 377/64; 377/78; 377/79

(58) Field of Classification Search .................. None
See application file for complete search history.

(56) References Cited

U.S. PATENT DOCUMENTS

| | | | |
|---|---|---|---|
| 2006/0056267 A1* | 3/2006 | Kim et al. ............. | 365/230.06 |
| 2007/0296681 A1* | 12/2007 | Kim et al. ............. | 345/100 |
| 2008/0001904 A1* | 1/2008 | Kim et al. ............. | 345/100 |

* cited by examiner

*Primary Examiner* — Lixi C Simpson
(74) *Attorney, Agent, or Firm* — Cantor Colburn LLP

(57) ABSTRACT

A gate driving circuit includes cascaded stages, each including a pull-up part, a carry part, a pull-up driving part, a holding part and an inverter. The pull-up part pulls up a gate voltage to an input clock. The carry part pulls up a carry voltage to the input clock. The pull-up driving part is connected to a control terminal (Q-node) common to the carry part and the pull-up part, and receives a previous carry voltage from a previous stage to turn on the pull-up part and the carry part. The holding part holds the gate voltage at an off-voltage, and the inverter controls at least one of turning on the holding part and turning off the holding part based on an inverter clock. A high level of the inverter clock in a given horizontal period (1H) temporally precedes a high level of the input clock by a predetermined time interval.

14 Claims, 7 Drawing Sheets

GATE DRIVING CIRCUIT AND DISPLAY APPARATUS HAVING THE SAME

This application claims priority to Korean Patent Application No. 2008-09212, filed on Jan. 29, 2008, and all the benefits accruing therefrom under 35 U.S.C. §119, the contents of which in its entirety are herein incorporated by reference.

BACKGROUND OF THE INVENTION

1. Field of the Invention

The present invention relates to a gate driving circuit and a display apparatus including the gate driving circuit. More particularly, the present invention relates to a gate driving circuit having substantially improved output characteristics thereof, and a display apparatus including the gate driving circuit.

2. Description of the Related Art

In general, a liquid crystal display includes a liquid crystal display panel to display a desired image thereon. The liquid crystal display panel includes a lower substrate, an upper substrate facing the lower substrate and a liquid crystal layer interposed between the lower substrate and the upper substrate. The liquid crystal display panel further includes a plurality of gate lines, a plurality of data lines and a plurality of pixels. Each pixel of the plurality of pixels is connected to a corresponding gate line of the plurality of gate lines and a corresponding data line of the plurality of data lines. A gate driving circuit outputs a gate signal to the gate lines and is directly formed on the liquid crystal display panel through a thin film process, for example.

The gate driving circuit generally includes a shift register including a plurality of stages, each stage of the plurality of stages being connected one after another, e.g., cascaded. Each stage includes a plurality of transistors which output a gate voltage to a corresponding gate line. More specifically, each stage includes a pull-up transistor connected to the gate line to output the gate voltage to the corresponding gate line.

In a gate driving circuit of the prior art, a control terminal of the pull-up transistor is connected to a Q-node in each stage. Particularly, the Q-node is maintained at an electric potential of a turn-on voltage which is greater than a threshold voltage of the pull-up transistor during a horizontal scanning period ("1H") during which the gate voltage is maintained at a high state, e.g. a high level. Thus, during a 1H period, the gate voltage output from the pull-up transistor is maintained at a turn-on voltage level. In contrast, the Q-node is maintained at a turn-off voltage level less than the threshold voltage of the pull-up transistor in a previous period, e.g., an (n−1)H period, during which the gate voltage is maintained at a low state, e.g., a low level. Therefore, the gate voltage output from the pull-up transistor is maintained at an off-voltage level during the (n−1)H period.

Meanwhile, in the gate driving circuit of the prior art, the electric potential at the Q-node ripples at a transition time of an input clock is input to the gate driving circuit during the (n−1)H period. When the electric potential of the Q-node ripples, the gate voltage output from the pull-up transistor is also rippled during the (n−1)H period.

In order to prevent the ripple of the gate voltage output from the pull-transistor, the gate driving circuit of the prior art requires a holding transistor which holds the gate voltage at the off-voltage level during the (n−1)H period, as well as an inverter which controls turn-on and turn-off operations of the holding transistor based on the input clock. The inverter outputs one of a high level and a low level of the input clock as its output signal, based on the input clock. The holding transistor applies the off-voltage to an output terminal of the pull-up transistor in response to the output signal at the high level. Therefore, the gate voltage is held at the off-voltage level.

However, due to a signal delay, the holding transistor is not able to hold the gate voltage at the off-voltage level until after a signal delay time lapses after a time when the input clock is input to the inverter. As a result, the gate driving circuit of the prior art is not able to hold the ripple component of the gate voltage generated at the transition time of the input clock at the off-voltage level.

Thus, it is desired to develop a gate driving circuit which prevents a ripple of a gate voltage.

BRIEF SUMMARY OF THE INVENTION

The present invention provides a gate driving circuit which effectively prevents a ripple of a gate voltage.

The present invention also provides a display apparatus including the gate driving circuit which effectively prevents a ripple of a gate voltage therein.

According to an exemplary embodiment of the present invention, a gate driving circuit includes cascaded stages. Each of the stages includes a pull-up part, a carry part, a pull-up driving part, a holding part and an inverter.

The pull-up part pulls up a gate voltage to an input clock. The carry part pulls up a carry voltage to the input clock. The pull-up driving part is connected to a control terminal ("Q-node") of the carry part and the pull-up part, and receives a previous carry voltage from a previous stage to turn on the pull-up part and the carry part. The holding part holds the gate voltage the off-voltage. The inverter turns on the holding part or turns off the holding part based on an inverter clock. A high level of the inverter clock in a given horizontal scanning period ("1H") temporally precedes a high level of the input clock by a predetermined time interval in the given horizontal scanning period 1H.

In an alternative exemplary embodiment of the present invention, a display apparatus includes a display part, a data driving circuit and a gate driving circuit. The display part displays an image based on a gate voltage and a data voltage. The data driving circuit applies the data voltage to the display part. The gate driving circuit includes cascaded stages which sequentially apply the gate voltage to the display part. Each of the stages includes a pull-up part, a carry part, a pull-down part, a pull-up driving part, a holding part and an inverter.

The pull-up part pulls up the gate voltage to an input clock during a horizontal scanning period (1H). The carry part pulls up a carry voltage to the input clock during the horizontal scanning period (1H). The pull-down part receives a subsequent gate voltage from a subsequent stage to lower the gate voltage to an off-voltage. The pull-up driving part is connected to a control terminal ("Q-node") of the pull-up part and the carry part and receives a previous carry voltage from a previous stage to turn on the pull-up part and the carry part and turns off the pull-up part and the carry part based on the subsequent gate voltage. The holding part holds the gate voltage at the off-voltage. The inverter turns on the holding part or turns off the holding part based on an inverter clock. A high level of the inverter clock in the horizontal scanning period (1H) temporally precedes a high level of the input clock by a predetermined time interval in the horizontal scanning period (1H).

In yet another exemplary embodiment of the present invention, method of driving a gate driving circuit comprising cascaded stages includes: pulling up a gate voltage to an input clock with a pull-up part; pulling up a carry voltage to the input clock with a carry part;

connecting a control terminal (Q-node), common to the carry part and the pull-up part, to a pull-up driving part; receiving a previous carry voltage from a previous stage with the pull-up driving part to turn on the pull-up part and the carry part; holding the gate voltage at an off-voltage with a holding part; and turning on the holding part with an inverter or turning off the holding part with the inverter based on an inverter clock.

A high level of the inverter clock in a given horizontal period (1H) temporally precedes a high level of the input clock by a predetermined time interval in the given horizontal period.

Thus, according to exemplary embodiments of the present invention, a gate driving circuit includes an inverter which controls holding transistor based on an inverter clock which temporally precedes an input clock by a predetermined time interval. Therefore, an output timing of an off-voltage output from the holding transistors is effectively prevented from occurring after a transition timing of the input clock. Thus, the gate driving circuit according to an exemplary embodiment holds a ripple voltage generated at the transition timing of the input clock to the off-voltage, e.g., substantially reduces and/or effectively prevents the ripple voltage.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
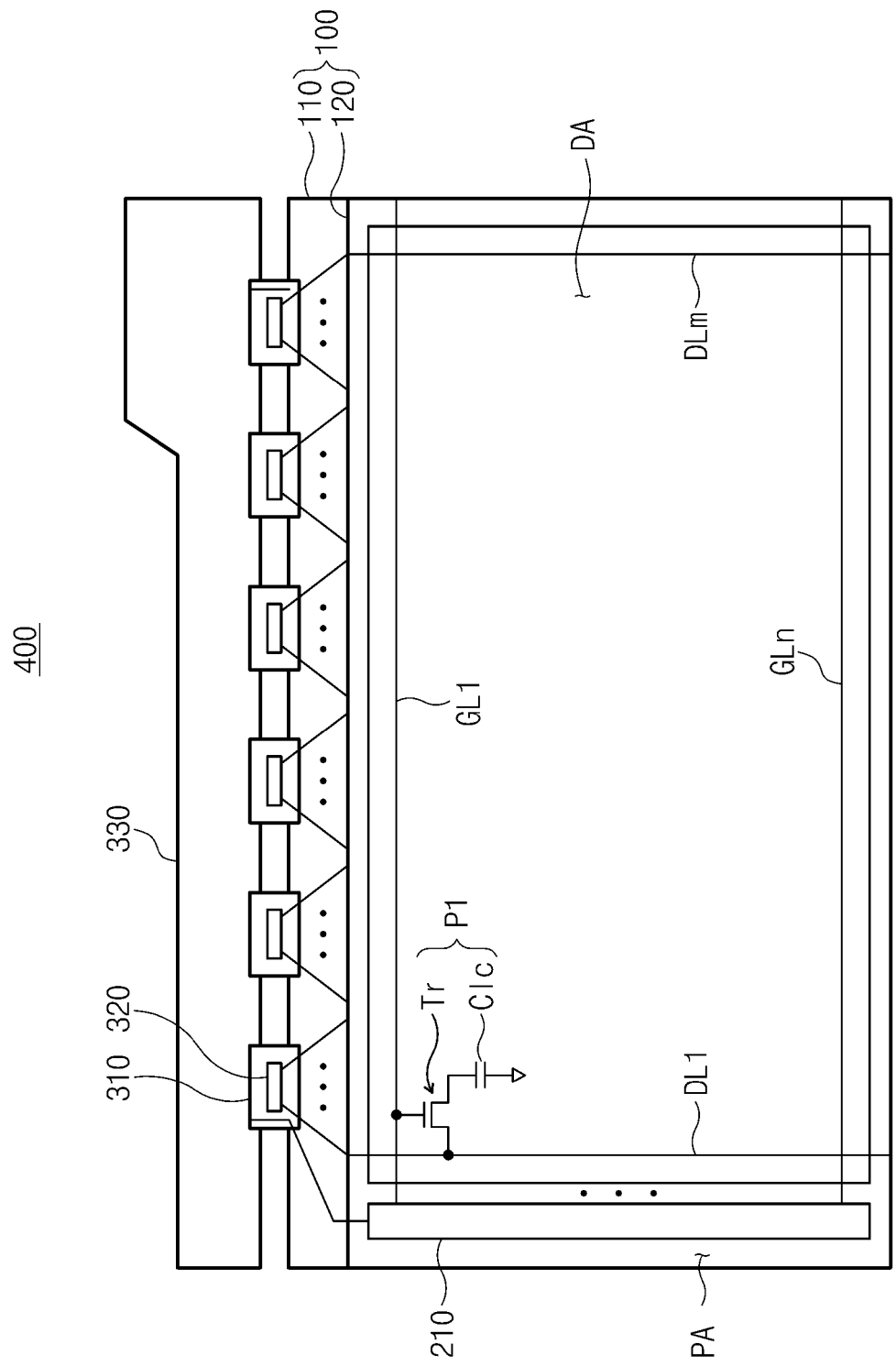
FIG. 1 is a plan view of a display device according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

FIG. 1 is a plan view of a display device according to an exemplary embodiment the present invention.

Referring to FIG. 1, a display device 400, e.g., a liquid crystal display ("LCD") 400 includes a liquid crystal display panel 100 which displays an image, a plurality of data driving chips 320 which outputs a data voltage to the liquid crystal display panel 100, and a gate driving circuit 210 which outputs a gate voltage to the liquid crystal display panel 100.

The liquid crystal display panel 100 includes a lower substrate 110, an upper substrate 120 facing the lower substrate 110 and a liquid crystal layer (not shown) interposed between the lower substrate 110 and the upper substrate 120. The liquid crystal display panel 100 includes a display area DA displaying the image and a peripheral area PA substantially adjacent to a peripheral area of the display area DA, as shown in FIG. 1.

In an exemplary embodiment of the present invention, pixel areas of a plurality of pixel areas are defined by gate lines GL of a plurality of gate lines GL1-GLn and data lines DL of a plurality of data lines DL1-DLm. The data lines DL are insulated from and cross the gate lines GL in a substantially matrix configuration in the display area DA. Each pixel area includes a pixel P1 including a thin film transistor Tr and a liquid crystal capacitor Clc. The thin film transistor Tr includes a gate electrode electrically connected to a first gate line GL1, a source electrode electrically connected to a first data line DL1 and a drain electrode electrically connected to a pixel electrode (not shown) which serves as a first electrode of the liquid crystal capacitor Clc.

The gate driving circuit 210 is disposed in the peripheral area PA adjacent to first ends of the gate lines GL of the plurality of gate lines GL1-GLn. The gate driving circuit 210 is electrically connected to the first ends of the gate lines GL of the plurality of gate lines GL1-GLn and sequentially applies the gate voltage to the gate lines GL.

A plurality of tape carrier packages ("TCPs") 310 are attached to the peripheral area PA adjacent to first ends of data lines DL of the plurality of data lines DL1-DLm. The data driving chips 320 are mounted on the TCPs 310. The data driving chips 320 are electrically connected to the first ends of the data lines DL to output the data voltage to the data lines D1 of the plurality of data lines DL1-DLm.

The LCD 400 further includes a printed circuit board ("PCB") 330 to control drive operations of each of the gate driving circuit 210 and the data driving chips 320. Specifically, the printed circuit board 330 outputs a data control signal and image data to control a drive operation of the data driving chips 320, and a gate control signal to control a drive operation of the gate driving circuit 210. The data control signal and the image data are applied to the data driving chips 320 through the TCPs 310. The gate control signal is applied to the gate driving circuit 210 through an associated TCP 310 of the TCPs 310, e.g., a TCP 310 adjacent to the respective gate driving circuit 210.

Figure 2:
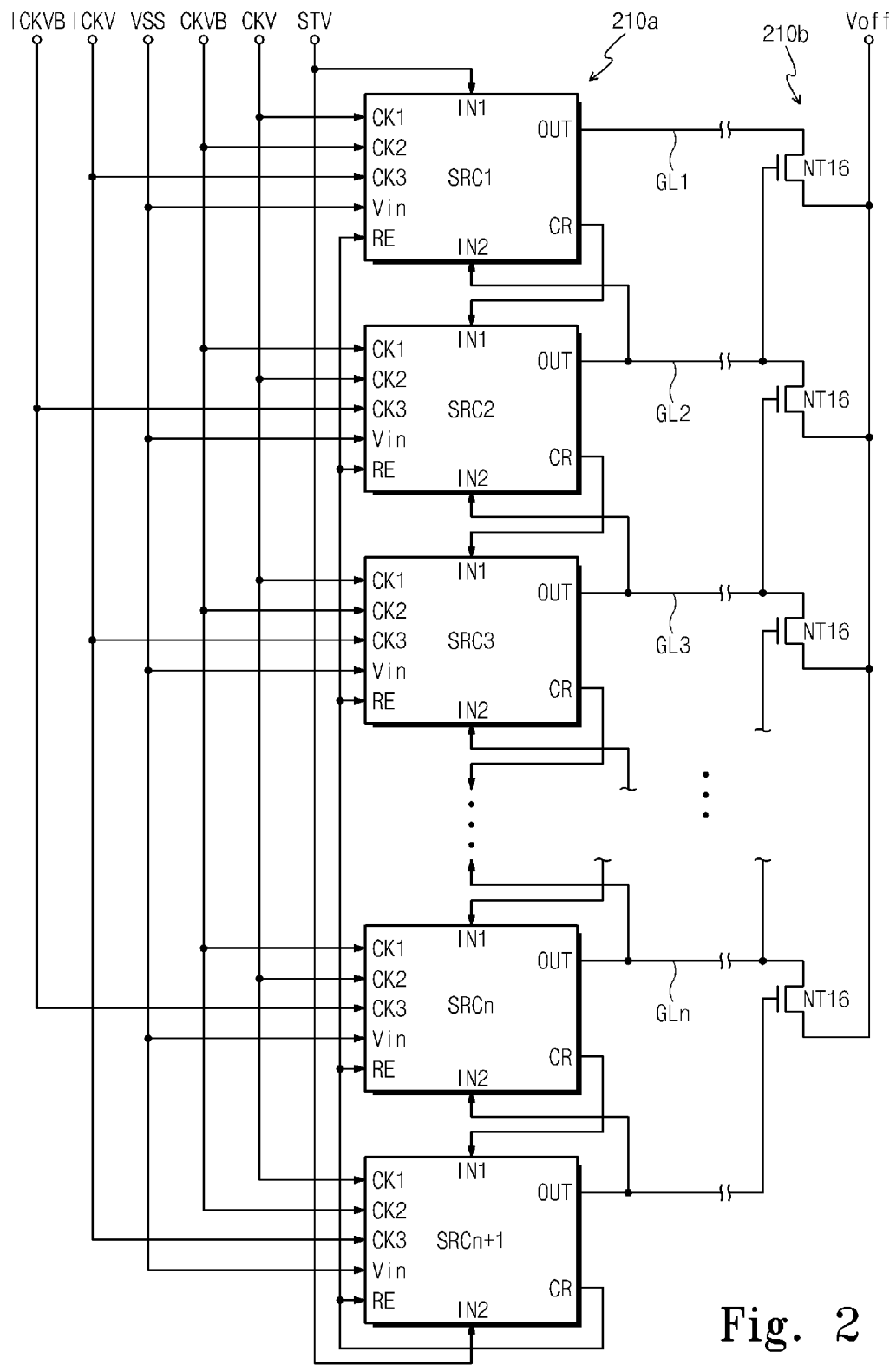
FIG. 2 is a block diagram of a gate driving circuit of the display device according to the exemplary embodiment of the present invention shown in FIG. 1.

FIG. 2 is a block diagram of a gate driving circuit of the display device according to the exemplary embodiment of the present invention shown in FIG. 1.

Referring to FIG. 2, the gate driving circuit 210 includes a shift register 210a in which a plurality of stages SRC1-SRCn+1 are connected one after another and to each other, e.g., stages of the plurality of stages SRC1-SRCn+1 are cascaded. Each stage includes a first input terminal IN1, a first clock terminal CK1, a second clock terminal CK2, a third clock terminal CK3, a second input terminal IN2, a voltage input terminal Vin, a reset terminal RE, an output terminal OUT and a carry terminal CR.

The first input terminal IN1 of each stage of the plurality of stages SRC1-SRCn+1 is electrically connected to the carry terminal CR of a previous stage and receives a previous carry voltage through the carry terminal CR of the previous stage. However, a start signal STV which starts a drive operation of the gate driving circuit 210 is applied to the first input terminal IN1 of a first stage SRC1 of the plurality of stages SRC1-SRCn+1.

The second input terminal IN2 of each stage of the plurality of stages SRC1-SRCn+1 is electrically connected to the output terminal OUT of a next stage to receive a next gate voltage. However, the start signal STV is applied to the second input terminal IN2 of a last stage SRCn+1 of the plurality of stages SRC1-SRCn+1.

An input clock, e.g., an input clock signal including a first clock CKV and a second clock CKVB, is applied to the first clock terminal CK or the second clock terminal CK2 of each stage and, more particularly, the first clock CKV or the second clock CKVB is applied to the first clock terminal CK1 or the second clock terminal CK2 of each individual stage of the plurality of stages SRC1-SRCn+1, depending upon whether the individual stage is an even-numbered stage or an odd-numbered staged, as described in further detail below.

A first inverter clock ICKV and a second inverter clock ICKVB, which temporally precedes the first clock CKV and the second clock CKVB, respectively, by a predetermined time (as described below in further detail with reference to FIG. 6), is applied to the third clock terminal CK3 of each individual stage of the plurality of stages SRC1-SRCn+1, depending upon whether the individual stage is an even-numbered stage or an odd-numbered stage, as described in greater detail below.

Figure 6:
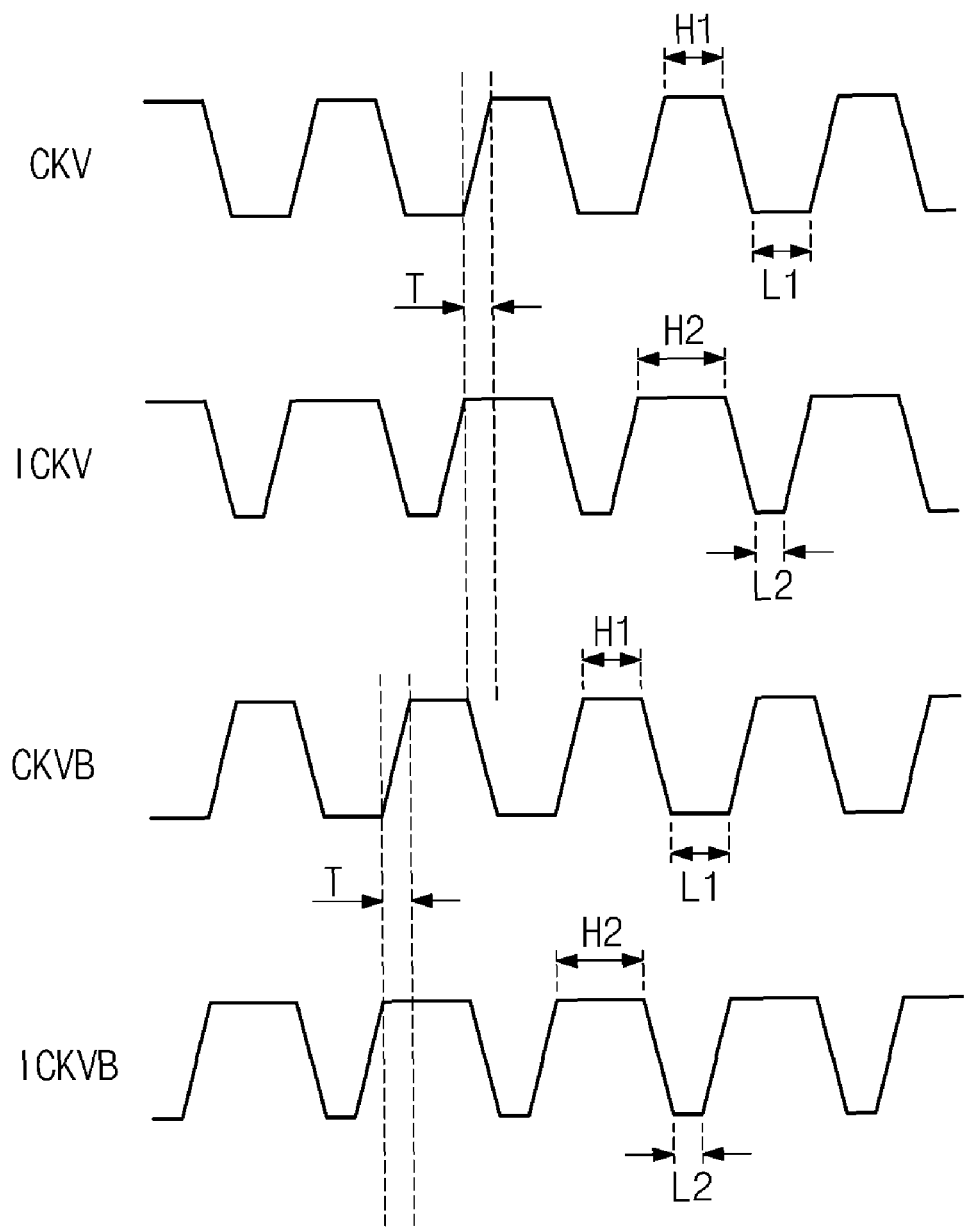
FIG. 6 is a signal timing diagram illustrating inputs to an inverter of the gate driving circuit of the display device according to the exemplary embodiment of the present invention shown in FIG. 3.

A phase of the first clock CKV is different from a phase of the second clock CKVB. In an exemplary embodiment of the present invention, the phase of the second clock CKVB is opposite to the phase of the first clock CKV. In an exemplary embodiment of the present invention, a phase of the first inverter clock ICKV has a same polarity as the phase of the first clock CKV, while a phase of the second inverter clock ICKVB has a same polarity as a phase of the second clock CKVB. Further, the phase of the second inverter clock ICKVB is opposite to the phase of the first inverter clock ICKV, as shown in FIG. 6 (and discussed in greater detail below).

Since the first inverter clock ICKV and the second inverter clock ICKVB temporally precede the first input clock CKV and the second input clock CKVB, respectively, by the predetermined time, the first inverter clock ICKV precedes the first clock CKV by the predetermined time and the second inverter clock ICKVB precedes the second clock CKVB by the predetermined time. Specifically, the first inverter clock ICKV and the second inverter clock ICKVB are each applied to a corresponding respective stage earlier than the first clock CKV and the second clock CKVB, respectively, by the predetermined time.

Still referring to FIG. 2., the first clock CKV is applied to first clock terminals CK1 of odd-numbered stages SRC1, SRC3, . . . , SRCn+1 of the plurality of stages SRC1-SRCn+1, and the second clock CKVB is applied to second clock terminals CK2 of the odd-numbered stages SRC1, SRC3, . . . , SRCn+1 of the plurality of stages SRC1-SRCn+1. In contrast, the second clock CKVB is applied to first clock terminals CK1 of even-numbered stages SRC2, . . . , SRCn of the plurality of stages SRC1-SRCn+1, while the first clock CKV is applied to the second clock terminals CK2 of the even-numbered stages SRC2, . . . , SRCn of the plurality of stages SRC1-SRCn+1.

In addition, the first inverter clock ICKV is applied to third clock terminals CK3 of the odd-numbered stages SRC1, SRC3, . . . , SRCn+1, and the second inverter clock ICKVB is applied to third clock terminals CK3 of the even-numbered stages SRC2, . . . , SRCn of the plurality of stages SRC1-SRCn+1, as shown in FIG. 2.

An off-voltage VSS is applied to voltage input terminals Vin of each stage of the plurality of stages SRC1-SRCn+1. In an exemplary embodiment of the present invention, the off-voltage VSS is a ground voltage VSS.

A carry terminal CR of the last stage SRCn+1 of the plurality of stages SRC1-SRCn+1 is electrically connected to reset terminals RE of each of the stages of the plurality of stages SRC1-SRCn+1.

Output terminals OUT of each stage of the plurality of stages SRC1-SRCn except the last stage SRCn+1 are electrically connected to a corresponding gate line GL of the plurality of gate lines GL1-GLn. Thus, the stages SRC1-SRCn sequentially output the gate voltage through respective output terminals OUT of each stage thereof, and the gate voltage is thereby applied to the plurality of gate lines GL1-GLn.

As shown in FIG. 2, the shift register 210a is disposed substantially adjacent to first ends of the gate lines GL of the plurality of gate lines GL1-GLn. In an exemplary embodiment of the present invention, the gate driving circuit 210 may further include a discharge circuit 210b disposed substantially adjacent to opposite second ends of the gate lines GL of the plurality of gate lines GL1-GLn, and which discharges a corresponding gate line GLi to the off-voltage VSS based on a voltage output from a subsequent gate line GLi+1 of an adjacent subsequent next stage of the plurality of stages SRC1-SRCn+1. Thus, the discharge circuit 201b includes a same number of discharge transistors NT16 as a number of gate lines GL, and each of the discharge transistors NT16 includes a control electrode connected to a subsequent gate line (e.g., the control electrode of the discharge transistor NT16 of the gate line GL2 is connected to the gate line GL3, as shown in FIG. 2), an input electrode receiving the off-voltage VSS and an output electrode connected to the present gate line (e.g., the gate line GLi).

Figure 3:
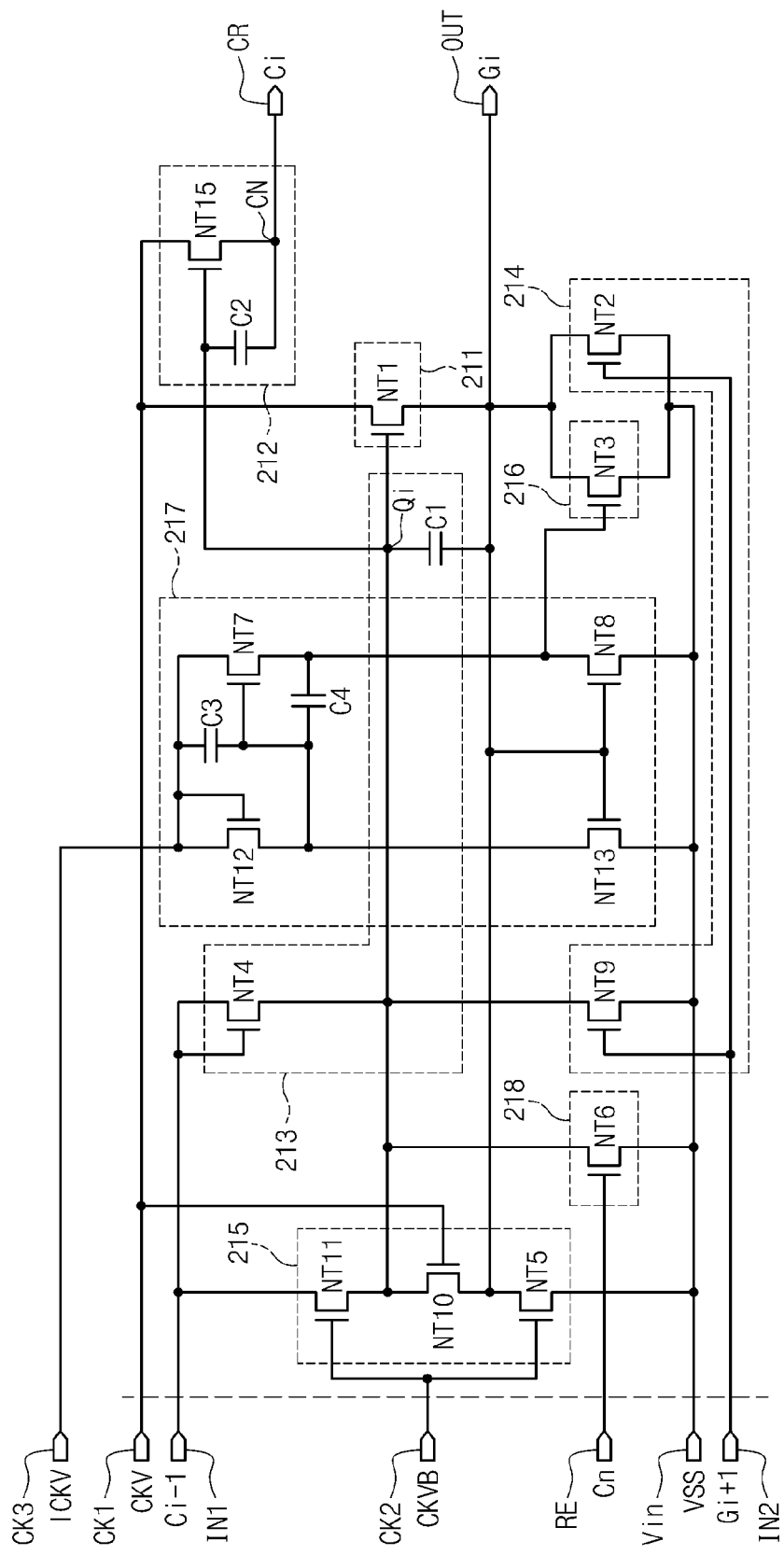
FIG. 3 is a schematic circuit diagram of a stage of the gate driving circuit of the display device according to the exemplary embodiment of the present invention shown in FIG. 2.

FIG. 3 is a schematic circuit diagram of a stage of the gate driving circuit of the display device according to the exemplary embodiment of the present invention shown in FIG. 2. Each stage of the gate driving circuit 210 according to an exemplary embodiment of present invention has substantially the same circuit configuration and function, and thus description of an inner circuit configuration of one stage, shown in FIG. 3, is representative of each stage of the plurality of stages SRC1-SRCn+1.

Referring now to FIG. 3, each stage includes a pull-up part 211, a carry part 212, a pull-up driving part 213, a pull-down part 214, a ripple preventing part 215, a holding part 216, an inverter 217 and a reset part 218.

The pull-up part 211 pulls up a gate voltage G to the first input clock CKV or the second input clock CKVB. For purposes of illustration, in the exemplary embodiment of the present invention shown in FIG. 3, the pull-up part 211 will be described assuming that the first clock CKV is input, e.g., that the stage shown in FIG. 3 is an odd-numbered stage. The pull-up part 211 includes a pull-up transistor NT1 including a control electrode connected to an output terminal, hereinafter referred to as a Q-node ("Qi"), of the pull-up driving part 213, an input electrode connected to the first clock terminal CK1 and an output electrode connected to the output terminal OUT. In operation, the pull-up transistor NT1 pulls up the gate voltage G. hereinafter referred to as a present gate voltage Gi, input to the output terminal OUT to the first clock CKV applied through the first clock terminal CK1 based on a control voltage output from the pull-up driving part 213 via the Q-node Qi, hereinafter referred to as a present Q-node Qi. The pull-up transistor NT1 is turned on during a one horizontal scanning period ("1H") corresponding to a high period of the first clock CKV in one frame, and maintains the present gate voltage Gi at a high state, e.g., the high period, during the 1H period.

The carry part 212 includes a carry transistor NT15 and a second capacitor C2. The carry transistor NT15 includes a control electrode connected to the present Q-node Qi, an input electrode connected to the first clock terminal CK1 and an output electrode connected to a carry terminal CR. The second capacitor C2 is connected between the control electrode of the carry transistor NT15 and the carry terminal CR. Thus, the carry transistor NT15 pulls up a carry voltage C (hereinafter referred to as a present carry voltage Ci) input to the carry terminal CR to the first clock CKV based on the control voltage output from the pull-up driving part 213 via the present Q-node Qi. Further, the carry transistor NT 15 is turned on during the 1H period in the one frame and maintains the present carry voltage Ci at a high state during the 1H period of the one period. Consequently, the present gate voltage Gi output from the pull-up part 211, as well as the present carry voltage Ci output from the carry part 212, are substantially the same, e.g., equivalent, signal generated during the same period (e.g., the 1H period of the one frame). Thus, the carry part 212 of the gate driving circuit 210 according to an exemplary embodiment of the present invention substantially reduces and/or effectively prevents a shading effect, since a load of the pull-up part 211 is decreased. In an exemplary embodiment of the present invention, a node to which the carry terminal CR and the output electrode of the carry transistor NT15 are connected is a present carry node CN, as illustrated in FIG. 3.

The pull-up driving part 213 is connected to control terminals of the pull-up part 211 and the carry part 212, e.g., to the present Q-node Qi, and receives a previous carry voltage Ci-1 from a previous stage of the plurality of stages SRC1-SRCn+1 to turn on the pull-up part 211 and the carry part 212. More specifically, the pull-up driving part 213 includes the present Q-node Qi, a buffer transistor NT4 and a first capacitor C1. The buffer transistor NT4 includes an input electrode and a control electrode commonly connected to the first input terminal IN1 and an output electrode connected to the present Q-node Qi. The first capacitor C1 is connected between the present Q-node Qi and the output terminal OUT. In an exemplary embodiment of the present invention, a node to which the first input terminal IN1 and the input electrode of the buffer transistor NT4 are connected is a previous carry node CN-1, as shown in FIG. 3.

When the buffer transistor NT4 is turned on based on the previous carry voltage Ci-1, an electric potential at the present Q-node Qi increases to the previous carry voltage Ci-1. Specifically, the electric potential at the present Q-node Qi is precharged to the previous carry voltage Ci-1. Then, the electric potential at the present Q-node Qi, precharged to the previous carry voltage Ci-1, is further boosted. As a result, the electric potential at the present Q-node Qi increases to be greater than a threshold voltage of the pull-up transistor NT1, thereby turning on the pull-up transistor NT1. Accordingly, the first clock CKV is input to the output terminal OUT and the carry terminal CR, and the present gate voltage Gi and the present carry voltage Ci transition to a high state. Further, the present gate voltage Gi and the present carry voltage Ci are maintained at the high state during the high period 1H of the first clock CKV of one frame.

The pull-down part 214 pulls down the present gate voltage Gi to the off-voltage VSS based on a next gate voltage Gi+1 from a subsequent stage of the plurality of stages SRC1-SRCn+1.

More specifically, the pull-down part 214 includes a first pull-down transistor NT2 and a second pull-down transistor NT9.

The first pull-down transistor NT2 includes a control electrode connected to the second input terminal IN2, an input electrode connected to the voltage input terminal Vin and an output electrode connected to the output terminal OUT. The first pull-down transistor NT2 pulls down, e.g., discharges, the present gate voltage Gi (which was previously pulled up by the first clock CKV) to the off-voltage VSS applied through the voltage input terminal Vin base on the next gate voltage Gi+1. Thus, the present gate voltage Gi transitions to a low state after the 1H period of the one frame.

The second pull-down transistor NT9 includes a control electrode connected to the second input terminal IN2, an input electrode connected to the voltage input terminal Vin and an output electrode connected to the present Q-node Qi. The second pull-down transistor NT9 discharges the first capacitor C1 to the off-voltage VSS based on the next gate voltage Gi+1. Thus, the electric potential at the present Q-node Qi is pulled down to the off-voltage VSS by the next gate voltage Gi+1. As a result, the pull-up transistor NT1 and the carry transistor NT2 are turned off. Put another way, the second pull-down transistor NT9 turns on after the 1H period of the one frame to turn off the pull-up transistor NT1 and the carry transistor NT2, thereby preventing an output of the present gate voltage Gi at a high state and an output of the present carry voltage Ci at a high state to the output terminal OUT and the carry terminal CR, respectively, after the 1H period of the one frame, e.g., during other horizontal periods of the one frame (hereinafter referred to as (n−1) horizontal periods of the one frame.

Still referring to FIG. 3, the ripple controller 215 includes a first ripple control transistor NT5, a second ripple control transistor NT10 and a third ripple control transistor NT11.

The first ripple control transistor NT5 includes an input electrode connected to the output terminal OUT, a control electrode connected to the second clock terminal CK2 and an output electrode connected to the voltage input terminal Vin. The second ripple control transistor NT10 includes a control electrode connected to the first clock terminal CK1, an input electrode connected to the present Q-node Qi and an output electrode connected to the output terminal OUT. The third ripple control transistor NT11 includes a control electrode connected to the second clock terminal CK2, an input electrode connected to the first input terminal IN1 and an output electrode connected to the present Q-node Qi.

The first ripple control transistor NT5 electrically connects the output terminal OUT to the voltage input terminal Vin based on the second clock CKVB applied to the second clock terminal CK2. Thus, the present gate voltage Gi of the output terminal OUT is discharged to the off-voltage VSS through the first ripple control transistor NT5.

The second ripple control transistor NT10 electrically connects the output terminal OUT to the present Q-node Qi based on the first clock CKV. Therefore, the electric potential at the present Q-node Qi is maintained at the present gate voltage Gi. Accordingly, after the 1H period, the electric potential of the present Q-node Qi is held at the off-voltage VSS in a subsequent high period of the first clock CKV during a remaining period (e.g., during the (n−1)H period) within the one frame. Thus, the second ripple control transistor NT10 prevents the pull-up transistor NT1 and the carry transistor NT15 from being turned on during the subsequent high period of the first clock CKV within the (n−1)H period of the one frame.

The third ripple control transistor NT11 electrically connects the previous carry node CN-1 to the present Q-node Qi based on the second clock CKVB applied through the second clock terminal CK2. Thus, the third ripple transistor NT11 provides the previous carry voltage Ci-1 to the present Q-node Qi, and the electric potential at the present Q-node Qi is thereby held at the off-voltage VSS during the high period of the second clock CKVB.

The holding part 216 holds the present gate voltage Gi at the off-voltage VSS, e.g., at a voltage level in a low state, after the 1H period when the present gate voltage Gi transitions from a high state to a low state. Specifically, the holding part 216 includes a holding transistor NT3 including a control electrode connected to an output terminal of the inverter 217, an input electrode connected to the voltage input terminal Vin and an output electrode connected to the output terminal OUT. After the 1H period, e.g., during the (n−1)H period, when an output voltage at a high state is applied from the inverter 217 to the control electrode of the holding transistor NT3, the holding transistor NT3 is turned on to apply the off-voltage VSS to the output terminal OUT. Thus, the present gate voltage Gi is held at the off-voltage VSS during the (n−1)H period of the one frame.

The inverter 217 turns on the holding transistor NT3 or turns off the holding transistor NT3 of the holding part 216 based on the first inverter clock ICKV. In an exemplary embodiment of the present invention, the inverter 217 receives the first inverter clock ICKV (which temporally precedes the first clock CKV by a predetermined time). In contrast, an inverter of the prior art controls turn-on and turn-off operations of the holding transistor NT3 based on the first clock CKV. In an exemplary embodiment of the present invention, however, the inverter 217 controls turn-on and turn-off operations of the holding transistor NT3 based on the first inverter clock ICKV which temporally precedes the first clock CKV by the predetermined time.

More specifically and still referring to FIG. 3, the inverter 217 includes a first inverter transistor NT12, a second inverter transistor NT7, a third inverter transistor NT13, a fourth inverter transistor NT8, a third capacitor C3 and a fourth capacitor C4.

The first inverter transistor NT12 includes an input electrode and a control electrode commonly connected to the third clock terminal CK3, and an output electrode connected to an output electrode of the second inverter transistor NT12 through the fourth capacitor C4.

The second inverter transistor NT7 includes an input electrode connected to the third clock terminal CK3, a control electrode connected to the input electrode thereof through the third capacitor C3 and the output electrode thereof connected to the control electrode of the holding transistor NT3.

The third inverter transistor NT13 includes an input electrode connected to the output electrode of the first inverter transistor NT12, a control electrode connected to the output terminal OUT and an output electrode connected to the voltage input terminal Vin.

The fourth inverter transistor NT8 includes an input electrode connected to the control electrode of the holding transistor NT3, a control electrode connected to the output terminal OUT and an output electrode connected to the voltage input terminal Vin.

The third inverter transistor NT13 and the fourth inverter transistor NT8 are turned on based on the present gate voltage Gi being at the high state, which is output through the output terminal OUT, and the first inverter clock ICKV output from the first inverter transistor NT12 and the second inverter transistor NT7 is thereby discharged to the off-voltage VSS. Thus, the holding transistor NT3 is maintained at a turn-off state during the 1H period during which the present gate voltage Gi is maintained in the high state. Then, when the present gate voltage Gi transitions to a low state, the third inverter transistor NT13 and the fourth inverter transistor NT8 are turned off, and the holding transistor NT3 is thereby turned on base on the first inverter clock ICKV output from the first inverter transistor NT12 and the second inverter transistor NT7.

As a result, the present gate voltage Gi is held at the off-voltage VSS by the holding transistor NT3 during subsequent high periods of the first inverter clock ICKV among the (n−1)H period of the one frame.

As described above, the holding transistor NT3 is turned on based on the first inverter clock ICKV, which temporally precedes the first clock CKV by the predetermined time, and is output from the first inverter transistor NT12 and the second inverter transistor NT7. Accordingly and in contrast to the circuit configuration of the prior art (in which holding transistor is turned on by the first clock CKV), the holding transistor NT3 according to an exemplary embodiment of the present invention is turned on based on the first inverter clock ICKV (which temporally precedes the first clock CKV by the predetermined time). Consequently, an application time of the off-voltage VSS applied to the output terminal of the pull-up transistor NT1 by the holding transistor NT3 begins earlier than in the circuit configuration of the prior art.

Thus, the application time of the off-voltage VSS applied to the output terminal of the pull-up transistor NT1 begins earlier, and a ripple which reaches a noise level at a transition time of the first clock CKV is effectively prevented in the gate driving circuit 210 according to an exemplary embodiment of the present invention.

Still referring to FIG. 2, the reset part 218 includes a reset transistor NT6 including a control electrode connected to the reset terminal RE, an input electrode connected to the control electrode of the pull-up transistor NT1 and an output electrode connected to the voltage input terminal Vin. The reset transistor NT6 discharges a noise input through the first input terminal IN1 to the off-voltage VSS based on a last carry voltage Cn+1 input through the reset terminal RE and output from the last stage SRCn+1 of the plurality of stages SRC1-SRCn+1. Accordingly, the pull-up transistor NT1 and the carry transistor NT15 are turned off based on the last carry voltage Cn+1 of the last stage SRCn+1. Consequently, the last carry voltage Cn+1 is provided to reset terminals RE of previous stages to turn off the pull-up transistor NT1 and the carry transistor NT15 of each previous stage of the plurality of stages SRC1-SRCn+I to reset each previous stage of the plurality of stages SRC1-SRCn+1.

Figure 4:
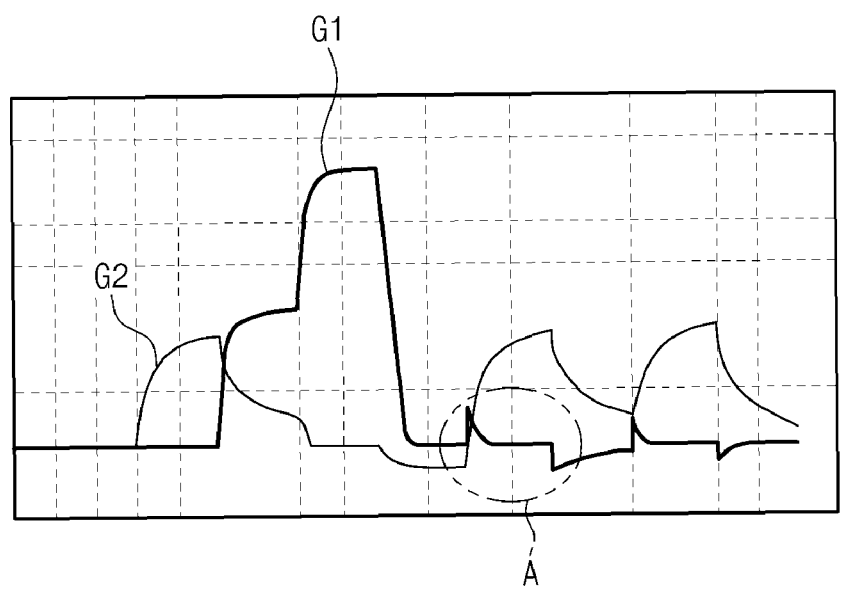
FIG. 4 is a graph of voltage versus time showing an output waveform of an inverter and an electric potential at a Q-node in a gate driving circuit of the prior art.
Figure 5:
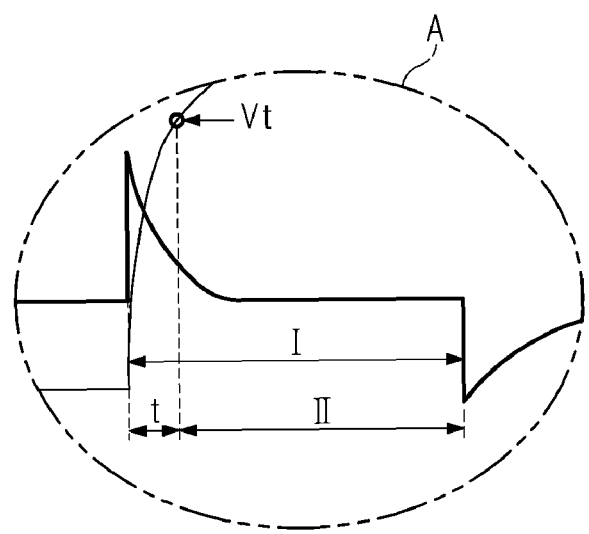
FIG. 5 is an enlarged view showing of portion "A" of FIG. 4.

FIG. 4 is a graph of voltage V versus time t showing an output waveform of an inverter and an electric potential at a Q-node in a gate driving circuit of the prior art, and FIG. 5 is an enlarged view of portion "A" of FIG. 4.

Referring to FIG. 4, a first graph GI represents an electric potential at a Q-node, and a second graph G2 represents an output waveform of a first clock CKV output from an inverter in a gate driving circuit of the prior art. As shown in FIG. 4, a ripple of the Q-node occurs at a transition time of the first clock CKV. In addition, the inverter in the gate driving circuit of the prior art receives the first clock CKV and outputs the first clock CKV as the output waveform G2, as shown in FIG. 4. Then, a holding transistor (not shown) in the gate driving circuit of the prior art is turned on based on the output waveform shown in FIG. 4, and starts to apply an off-voltage VSS to the output terminal of the pull-up transistor.

Meanwhile, in the gate driving circuit of the prior art, the holding transistor starts to apply the off-voltage VSS after a time period (t) (FIG. 5) lapses from a peak of the ripple since the output waveform from the inverter of the prior art requires the time period (t) to reach a threshold voltage of the holding transistor. Thus, in the gate driving circuit of the prior art, the holding transistor applies the off-voltage VSS to the output terminal of the pull-up transistor during a second period (II) which is shorter than a first period (I) (best shown in FIG. 5).

As a result, in the gate driving circuit of the prior art, the holding transistor does not hold the ripple of the gate voltage output from the pull-up transistor based on the ripple generated at the Q-node during the time period (t).

In an exemplary embodiment of the present invention, however, a method and display device in which the holding transistor NT3 is turned off earlier than in the gate driving circuit of the prior art is provided. Specifically, the inverter 217 controls the turn-on operation of the holding transistor NT3 based on the first inverter clock ICKV which temporally precedes the first clock CKV, e.g., the first inverter clock ICKV is earlier than first clock CKV, by the predetermined time, and the holding transistor NT3 is thereby turned on earlier (e.g., earlier by the predetermined time) than in the gate driving circuit of the prior art shown in FIGS. 4 and 5.

FIG. 6 is a signal timing diagram illustrating inputs to an inverter of the gate driving circuit of the liquid crystal display according to the exemplary embodiment of the present invention shown in FIG. 3. In FIG. 6, a first clock CKV, and first inverter clock ICKV, a second clock CKVB and a second inverter clock ICKVB are illustrated. The first inverter clock ICKV is the same as the second inverter clock ICKVB except for a phase difference therebetween and corresponding stages of the plurality of stages SRC1-SRCn+1 to which they are input. Therefore, the first inverter clock ICKV will be hereinafter be described in further detail, and any repetitive detailed description of the second inverter clock ICKVB will be omitted.

Referring now to FIG. 6, the first inverter clock ICKV includes a first period H2 during which the first inverter clock ICKV is maintained at a high level, and a second period L2 during which the first inverter clock ICKV is maintained at a low level. In an exemplary embodiment of the present invention, a duration of the second period L2 is less than a duration of the first period H2.

A first clock CKV includes a third period H1 during which the first clock CKV is maintained at the high level, and a fourth period L1 during which the first clock CKV is maintained at the low level. In an exemplary embodiment, a duration of the fourth period L1 is approximately equal to a duration of the third period H1.

The duration of the first period H2 of the first inverter clock ICKV is longer than the duration of the third period H1 of the first clock CKV by a predetermined time period T, and a duration of the second period L2 of the first inverter clock ICKV is shorter than a duration of the fourth period L1 of the first clock CKV. Thus, in operation of the gate driving circuit 210 according to an exemplary embodiment of the present invention, the first inverter clock ICKV is input to a corresponding stage of the plurality of stages SRC1-SRCn+1 temporally earlier than the first clock CKV by the time period T.

Since the first clock CKV and the second clock CKVB drive each stage of the plurality of stages SRC1-SRCn+1, the first clock CKV and the second clock CKVB according to an exemplary embodiment of present invention have approximately equal duty ratios. In contrast, since the first inverter clock ICKV and the second inverter clock ICKVB drive the odd-numbered stages and the even-numbered stages, respectively, the first inverter clock ICKV and the second inverter clock ICKVB according to an exemplary embodiment of present invention may have different duty ratios. In an exemplary embodiment of present invention, a duty ratio is a ratio of a duration of a high level in one period to a total duration of the one period.

Thus, as described above, the holding transistor NT3 is turned on based on the first inverter clock ICKV which temporally precedes the first clock CKV by the predetermined time period T, and the holding transistor NT3 of the gate driving circuit according to an exemplary embodiment thereby holds the ripple which occurs at the transition time of the first clock CKV to the off-voltage VSS. In addition, since the duration of the first period H2, during which the first inverter clock ICKV is maintained at the high level, is longer than the duration of the third period H1, during which the first clock CKV is maintained at the high level, output characteristics of the inverter part 217 according to an exemplary embodiment of the present invention are substantially improved.

Figure 7:
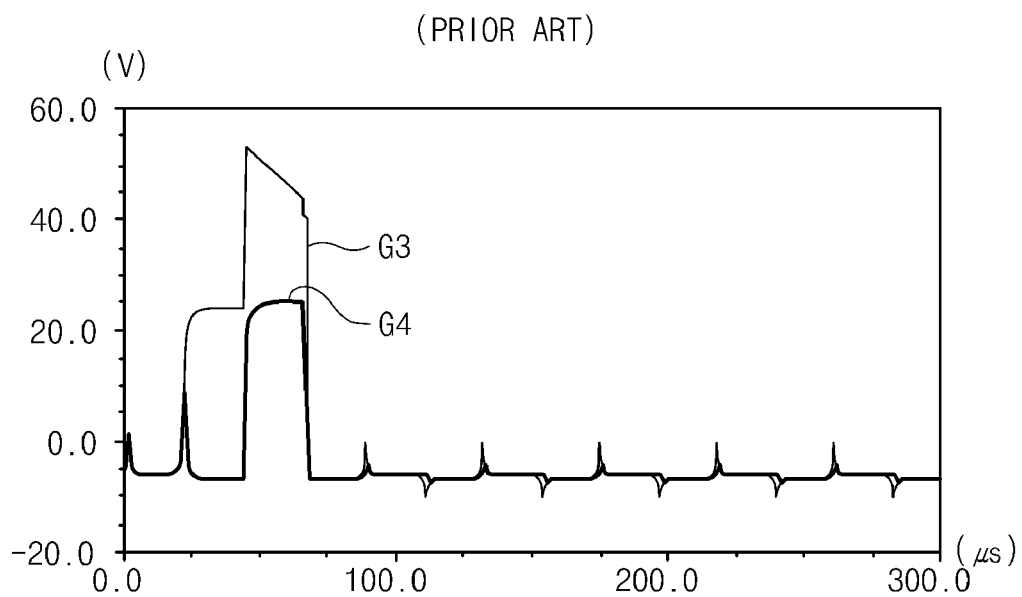
FIG. 7 is a graph of voltage versus time illustrating an electric potential at a Q-node of each stage and an output waveform of a gate voltage output from each stage in a gate driving circuit of the prior art.
Figure 8:
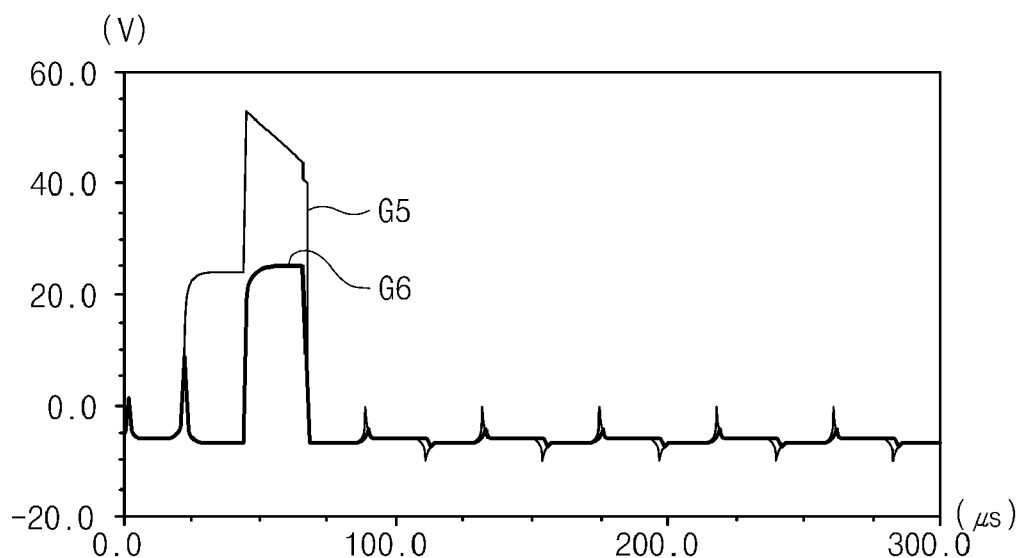
FIG. 8 is a graph of voltage versus time illustrating an electric potential at a Q-node of each stage and an output waveform of a gate voltage output from each stage in a gate driving circuit according to an exemplary embodiment of the present invention.

FIG. 7 is a graph of voltage V versus time t (in µs) illustrating an electric potential at a Q-node of each stage and an output waveform of a gate voltage output from each stage in a gate driving circuit of the prior art, and FIG. 8 is a graph of voltage V versus time t (in µs) illustrating an electric potential at a Q-node in each stage and an output waveform of a gate voltage output from each stage of a gate driving circuit according to an exemplary embodiment of the present invention. In FIGS. 7 and 8, waveforms therein were measured in a high, e.g., elevated, temperature operating environment (e.g., approximately 70° C.) under a normal driving condition of the gate driving circuits. In FIGS. 7 and 8, a third graph G3 and a fifth graph G5 indicate electric potentials at a Q-node of a gate driving circuit of the prior art and a gate driving circuit 210 according to an exemplary embodiment, respectively, while a fourth graph G4 and a sixth graph G6 indicate output waveforms of a gate voltage of the gate driving circuit of the prior art and the gate driving circuit 210 according to an exemplary embodiment, respectively.

As shown in FIGS. 7 and 8, the output waveform output from the gate driving circuit 210 according to an exemplary embodiment the present invention is substantially the same as the output waveform output from the gate driving circuit of the prior when the gate driving circuit of the prior art is operated under the normal driving condition. Therefore, FIGS. 7 and 8 illustrate that no driving malfunction occurs when the inverter 217 of the gate driving circuit 210 according to an exemplary embodiment of the present invention is driven in response to the first inverter clock ICKV.

Figure 9:
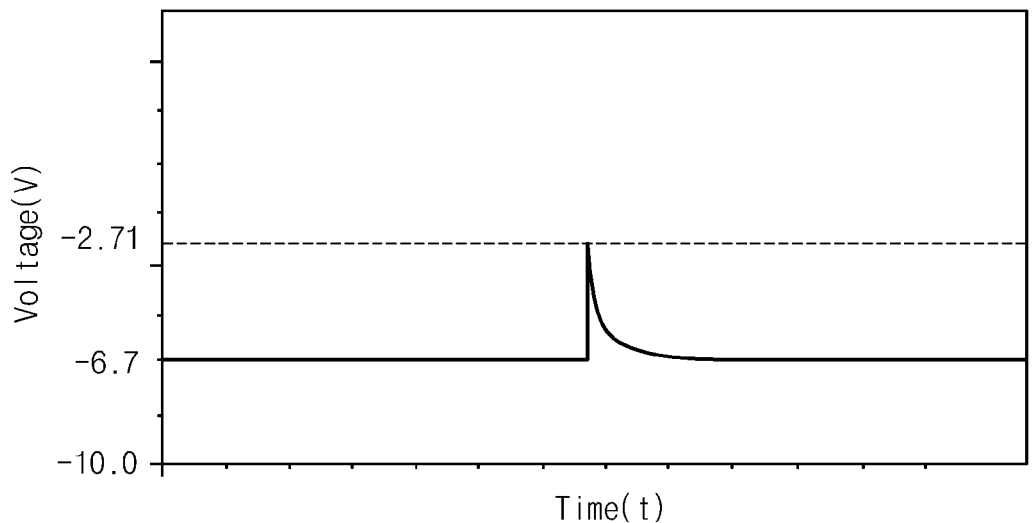
FIG. 9 is a graph of voltage versus time illustrating a ripple voltage at a Q-node of each stage in a gate driving circuit of the prior art.
Figure 10:
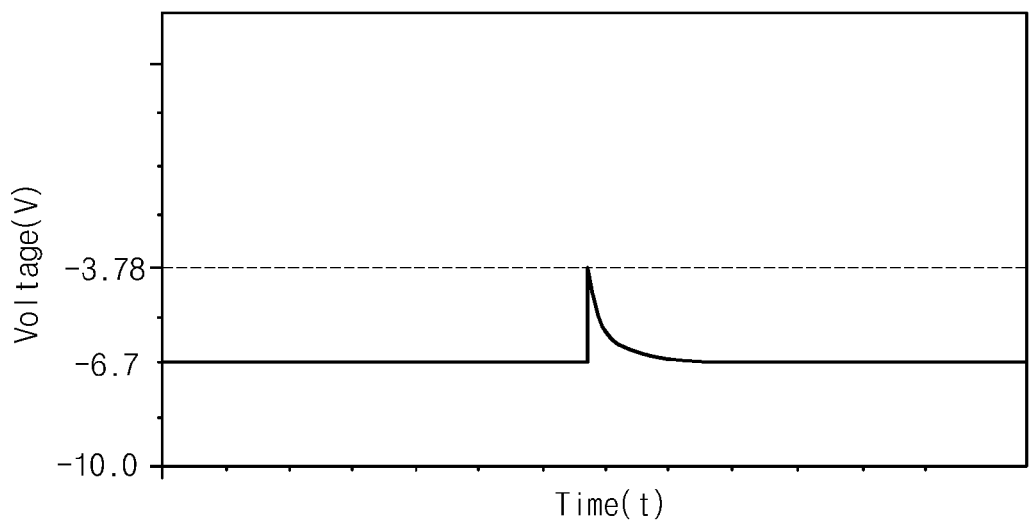
FIG. 10 is a graph of voltage versus time illustrating a ripple voltage at a Q-node of each stage in a gate driving circuit according to an exemplary embodiment of the present invention.

FIG. 9 is a graph of voltage versus time illustrating a ripple voltage appearing at a Q-node of each stage in a gate driving circuit of the prior art, and FIG. 10 is a graph of voltage versus time illustrating a ripple voltage appearing at a Q-node of each stage in a gate driving circuit according to an exemplary embodiment of the present invention. In FIGS. 9 and 10, an x-axis represents time t, and a y-axis represents a voltage V.

Referring to FIG. 9, in the gate driving circuit of the prior art, a voltage level of a ripple voltage generated at a Q-node increases from the off-voltage level (approximately −6.7V) to approximately −2.71V. In contrast, as shown in FIG. 10, in a gate driving circuit 210 according to an exemplary embodiment of the present invention, a voltage level of a ripple voltage generated at a Q-node increases from the off-voltage level (approximately −6.7V) to approximately −3.78. Therefore, in the gate driving circuit 210 according to an exemplary embodiment of the present invention, the voltage level of the ripple voltage is decreased by approximately 1.07V compared to the voltage level of the ripple voltage generated at the Q-node in the gate driving circuit of the prior art.

Consequently, in an exemplary embodiment of the present invention, the ripple voltage generated at the output terminal of the pull-up transistor NT1 at the transition time of the first clock CKV, as well as the ripple voltage generated at the control terminal of the pull-up transistor NT1 (e.g., at the Q-node) is substantially reduced and/or effectively minimized.

In addition, as described above, the gate driving circuit 210 and the display apparatus 400 includes the inverter 217 to control the holding transistor NT3 based on the first inverter clock ICKV which temporally precedes the first clock CKV by the predetermined time interval T. Thus, output timing of the off-voltage VSS output from the holding transistor NT3 is effectively prevented from being later than the transition time of the first clock CKV.

According to exemplary embodiments of the present invention as described herein, a gate driving circuit and a display apparatus including the same hold a ripple voltage generated at a transition timing of an input clock to a voltage level of an off-voltage, thereby substantially improving output characteristics of the gate driving circuit and the display apparatus having the same.

While the present invention has been particularly shown and described with reference to exemplary embodiments thereof, it will be understood by those of ordinary skill in the art that various changes and modifications in form and details may be made therein without departing from the spirit or scope of the present invention as defined by the following claims.

What is claimed is:

1. A gate driving circuit comprising stages, the stages being cascaded with each other and each comprising:
   a pull-up part which pulls up a gate voltage to an input clock;
   a carry part which pulls up a carry voltage to the input clock;
   a pull-up driving part connected to a control terminal (Q-node) common to the carry part and the pull-up part and which receives a previous carry voltage from a previous stage to turn on the pull-up part and the carry part;

a pull-down part receiving a subsequent gate voltage from a subsequent stage to lower the gate voltage to the off-voltage;

a holding part which holds the gate voltage at an off-voltage; and an inverter for at least one of turning on the holding part and turning off the holding part based on an inverter clock, wherein a high level of the inverter clock in a given horizontal scanning period (1H) temporally precedes a high level of the input clock by a predetermined time interval in the given horizontal scanning period (1H).

2. The gate driving circuit of claim 1, wherein the inverter comprises:

a first inverter transistor including an input electrode and a control electrode which receive the inverter clock;

a second inverter transistor including an input electrode which receives the inverter clock, a control electrode connected to the input electrode of the second inverter transistor through a first capacitor and an output electrode connected to an output electrode of the first inverter transistor through a second capacitor and further connected to a control terminal of the holding part;

a third inverter transistor including an input electrode connected to the output electrode of the first inverter transistor, a control electrode connected to an output terminal of the pull-up part and an output electrode which receives the off-voltage; and a fourth inverter transistor including an input electrode connected to the control terminal of the holding part, a control electrode connected to the output terminal of the pull-up part and an output electrode which receives the off-voltage.

3. The gate driving circuit of claim 2, wherein the holding part comprises a holding transistor including a control electrode connected to the input electrode of the fourth inverter transistor, an input electrode which receives the off-voltage and an output electrode connected to the output terminal of the pull-up part.

4. The gate driving circuit of claim 1, wherein the inverter clock comprises:

a first period during which the inverter clock is maintained at a high level; and a second period during which the inverter clock is maintained at a low level, wherein a duration of the second period is less than a duration of the first period.

5. The gate driving circuit of claim 4, wherein the input clock comprises:

a third period during which the input clock is maintained at the high level; and a fourth period during which the input clock is maintained at the low level, wherein a duration of the third period is equal to a duration of the fourth period, and the duration of the first period of the inverter clock is greater than the duration of the third period of the input clock.

6. The gate driving circuit of claim 5, wherein the duration of the second period of the inverter clock is less than the duration of the fourth period of the input clock.

7. The gate driving circuit of claim 4, wherein the inverter clock further comprises a first inverter clock and a second inverter clock, a phase of the second inverter clock is opposite to a phase of the first inverter clock, the first inverter clock is input to inverters disposed in odd-numbered stages of the stages, and the second inverter clock is input to inverters disposed in even-numbered stages of the stages.

8. The gate driving circuit of claim 1, wherein the pull-up part comprises a pull-up transistor including a control electrode connected to the Q-node, an input electrode which receives the input clock and an output electrode which outputs the gate voltage.

9. The gate driving circuit of claim 8, wherein the pull-up driving part comprises:

a buffer transistor including a control electrode and an input electrode which receive the previous carry voltage, and an output electrode connected to the Q-node; and a third capacitor connected between the control electrode of the pull-up transistor and the output electrode of the pull-up transistor.

10. The gate driving circuit of claim 1, wherein the carry part comprises a carry transistor including a control electrode connected to the Q-node, an input electrode which receives the input clock and an output electrode which outputs the carry voltage.

11. A display apparatus comprising:

a display part which displays an image based on a gate voltage and a data voltage;

a data driving circuit which applies the data voltage to the display part; and a gate driving circuit comprising stages which sequentially apply the gate voltage to the display part, the stages being cascaded with each other and each of the stages of the gate driving circuit comprising:

a pull-up part which pulls up the gate voltage to an input clock during a given horizontal scanning period (1H);

a carry part which pulls up a carry voltage to the input clock during the given horizontal scanning period (1H);

a pull-down part which receives a subsequent gate voltage from a subsequent stage to lower the gate voltage to an off-voltage;

a pull-up driving part connected to a control terminal (Q-node) common to the carry part and the pull-up part and which receives a previous carry voltage from a previous stage to turn on the pull-up part and the carry part, and which turns off the pull-up part and the carry part based on the subsequent gate voltage;

a holding part which holds the gate voltage at the off-voltage; and an inverter for at least one of turning on the holding part and turning off the holding part based on an inverter clock, wherein a high level of the inverter clock in the given horizontal scanning period (1H) temporally precedes a high level of the input clock by a predetermined time interval in the given horizontal scanning period (1H).

12. The display apparatus of claim 11, wherein the inverter comprises:

a first inverter transistor including an input electrode and a control electrode which receive the inverter clock;

a second inverter transistor including an input electrode which receives the inverter clock, a control electrode connected to the input electrode of the second inverter transistor through a first capacitor and an output electrode connected to an output electrode of the first inverter transistor through a second capacitor and further connected to a control terminal of the holding part;

a third inverter transistor including an input electrode connected to the output electrode of the first inverter transistor, a control electrode connected to an output terminal of the pull-up part and an output electrode which receives the off-voltage; and a fourth inverter transistor including an input electrode connected to the control terminal of the holding part, a control electrode connected to the output terminal of the pull-up part and an output electrode which receives the off-voltage.

13. The display apparatus of claim 12, wherein the inverter clock comprises:

a first period during which the inverter clock is maintained at a high level; and a second period during which the inverter clock is maintained at a low level, wherein a duration of the second period is less than a duration of the first period.

14. The display apparatus of claim 13, wherein the inverter clock further comprises a first inverter clock and a second inverter clock, a phase of the second inverter clock is opposite to a phase of the first inverter clock, the first inverter clock is input to inverters disposed in odd-numbered stages of the stages, and the second inverter clock is input to inverters disposed in even-numbered stages of the stages.

* * * * *